United States Patent

Schroeder

[15] 3,638,202

[45] Jan. 25, 1972

[54] ACCESS CIRCUIT ARRANGEMENT FOR EQUALIZED LOADING IN INTEGRATED CIRCUIT ARRAYS

[72] Inventor: Paul Robert Schroeder, Allentown, Pa.

[73] Assignee: Bell Telephone Laboratories Incorporated, Berkeley Heights, N.J.

[22] Filed: Mar. 19, 1970

[21] Appl. No.: 21,090

[52] U.S. Cl.........................340/173 FF, 207/251, 307/279, 307/304

[51] Int. Cl...........................................................G11c 5/06

[58] Field of Search.............340/173 FF; 307/205, 251, 273, 307/304; 317/235 G

[56] References Cited

UNITED STATES PATENTS

| | | | |
|---|---|---|---|
| 3,518,635 | 6/1970 | Cole et al. | 307/279 X |
| 3,365,707 | 1/1968 | Mayhew | 340/173 FF |
| 3,295,031 | 12/1966 | Schmitz | 340/173 FF |
| 3,447,137 | 5/1969 | Feuer | 307/279 X |

*Primary Examiner*—Eugene G. Botz
*Assistant Examiner*—James F. Gottman
*Attorney*—R. J. Guenther and Kenneth B. Hamlin

[57] ABSTRACT

Metalized row and column access circuits for an integrated circuit memory chip each includes crossunders to accommodate intersecting circuits along about half of the extent of such circuit on the chip and no crossunders for the remainder of its extent. The distribution of crossunders along each circuit is such that the bulk of the included crossunders are in the part of the circuit more remote from the circuit-driving point than is the part which is essentially free of crossunders. Metalized bit circuits for the chip are arranged so that they always extend physically parallel to access circuit parts which are free of crossunders so that the bit circuits are entirely free of crossunders. Schematic and actual layouts for a cell used in such a memory chip are shown.

13 Claims, 7 Drawing Figures

INVENTOR
P. R. SCHROEDER
BY
Charles Scott Phelan
ATTORNEY

ACCESS CIRCUIT ARRANGEMENT FOR EQUALIZED LOADING IN INTEGRATED CIRCUIT ARRAYS

BACKGROUND OF THE INVENTION

1. Field of the Invention

This invention relates to semiconductor-integrated circuit arrays in which plural circuit cells are formed in a single chip of semiconductor material and interconnected within the chip or by externally deposited metallic circuits. The invention relates particularly to arrays wherein the metallic circuits intersect one another.

2. Description of the Prior Art

It is well known in the art that integrated circuit arrays in a single chip of semiconductor material can be provided with associated circuits which intersect one another. Such circuit intersections are termed "crossovers" or "crossunders" depending upon whether specialized structure employed at the circuit intersection allows one circuit to bridge over or tunnel under the other circuit. The present invention deals primarily with circuit intersection structures which inject substantial additional impedance into the electric circuit network as a result of the inclusion of special intersection structure. For convenience, the remainder of the application is cast in terms of circuit crossunders.

Crossunder structure electrical impedance is significant and can have a substantial effect on signal transmission and thus on circuit access time. Circuit access time is of considerable importance in a circuit, such as a memory, that is repeatedly accessed. Time delays encountered in applying electric signals to gain access to such a circuit are repeatedly effective to delay any system in which the circuit is used, and their cumulative effect can be a serious impediment to the entire system.

In spite of the foregoing access time considerations, some circuit designs for coincident access integrated circuits have imposed circuit crossunder burdens primarily on one of several types of access circuits for purposes of chip layout simplicity. The different signal rise times that result on different integrated circuit chip access circuits are simply tolerated by adapting the chip network operation to the worst case rise time. As applied to semiconductor memories, such an approach may force row circuits, for example, to suffer the bulk of the crossunders with the result that signal rise time at a remote end of a row circuit would be much longer than the rise time for similar column circuit signals, and the memory cycle time would be correspondingly extended. Other circuit designs have more nearly equalized the crossunder loading between row and column circuits but in the process have used large numbers of crossunders evenly distributed along circuits so that both row and column circuits have similar long signal rise times.

SUMMARY OF THE INVENTION

By way of solution to the problem represented by the foregoing operating time considerations, the present invention contemplates that one circuit set of plural sets of circuits on a semiconductor-integrated circuit chip is allowed to be purely metallic and free of higher impedance crossunder structures. At least second and third circuit sets in the same plane with the first set, and intersecting the first set and each other, are diverted to cross under an intersecting circuit in a fashion such that equivalent impedances represented by the crossing structures are approximately equally distributed between the circuits of the second and third sets. To this end, in an illustrative embodiment of the invention, intersecting row and column circuits of an integrated circuit chip share the necessary crossunders to make the characteristic impedances of such circuits all approximately the same.

In an illustrative memory embodiment of the invention, memory digit circuits are segmented to extend with different orientations in different parts of the chip. The digit circuit segments extend parallel to the one of the row or column circuits including the least crossunders in the same part of the chip so that the digit circuits are free of crossunders. In accordance with a further aspect of the invention, crossunders along any row or column circuit are grouped primarily in a circuit part which is remote from the driving point of the circuit.

BRIEF DESCRIPTION OF THE DRAWING

A more complete understanding of the invention and its various features, objects, and advantages may be obtained from the following description of the invention as applied to a memory system such as that depicted in the drawing wherein.

DETAILED DESCRIPTION

Figure 1:
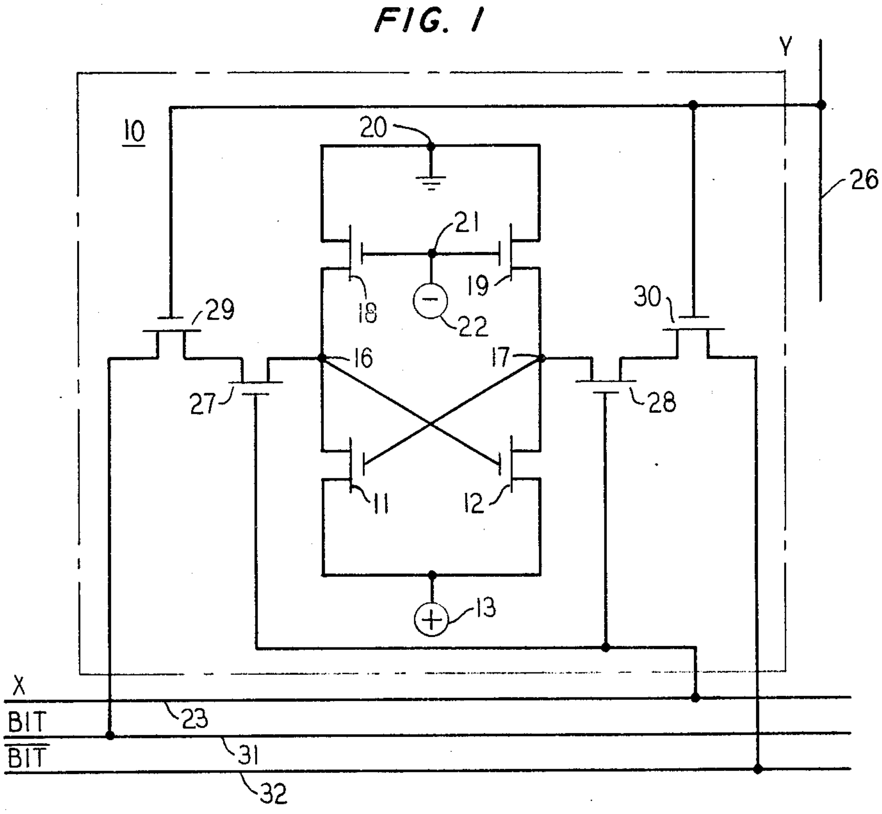
FIG. 1 is a schematic diagram of a bistable, or flip-flop, circuit employed as a memory cell in an embodiment of the invention.

In FIG. 1 is depicted a memory cell 10 utilizing field effect transistors interconnected in a form of flip-flop circuit which is known in the art for storing binary coded information. The transistors are advantageously P-channel insulated gate field effect transistors having different selected gain levels to facilitate operation as a memory cell. Transistors having source and drain formed by known diffusion techniques are advantageously employed in the illustrative embodiment.

In the flip-flop circuit per se two transistors 11 and 12 are cross-coupled drain-to-gate. Source electrodes of the transistors are connected to a B+ operating potential source 13 which is schematically represented by a circled plus sign to indicate a source of potential with its positive terminal connected as shown and having its negative terminal connected to ground. Similar schematic notation with appropriate polarity signs is employed throughout the drawing. Drain electrodes of transistors 11 and 12 are connected to flip-flop circuit output terminals 16 and 17, respectively, and to source electrodes of two additional transistors 18 and 19 which are arranged to operate as load resistors in the flip-flop circuit. Drain electrodes of the latter two transistors are connected together at a terminal 20 which is also connected to ground. Gate electrodes of the same load transistors are connected together at a terminal 21 which is also connected to a negative potential source 22.

Access to the flip-flop circuit just described in cell 10 is attained by the coincident application of voltage signals on an X-circuit 23 and a Y-circuit 26. The latter signals are advantageously driven from a positive level toward ground to enable conduction in a pair of X-gate transistors 27 and 28 and a pair of Y-gate transistors 29 and 30, respectively. When such enabling signals are applied in coincidence to the gate electrodes of the indicated X-gate and Y-gate transistors, conduction can take place in either direction between the output terminal 16 and a Bit circuit 31 and between the output terminal 17 and a $\overline{\text{Bit}}$ circuit 32. Double-rail logic signals are applied from a digit drive source, not shown, by way of the Bit and $\overline{\text{Bit}}$ circuits to drive the flip-flop circuit into one of its stable states which is indicated by the digit signals. Similarly, during a memory readout operation the binary state of information stored in the cell 10 and represented by different voltage levels at output terminals 16 and 17 is coupled through the gate transistors and the same Bit and $\overline{\text{Bit}}$ circuits to a digit detector, also not shown.

During standby operation of the cell holding current flows from the source 13 and through the bistable circuit to ground to maintain a particular stable state. During readout some of the cell current which flows from source 13 through the conducting one of the transistors 11 or 12 is diverted through gate transistors to one of the Bit or $\overline{\text{Bit}}$ circuits and the digit detector to reach the ground return path for the source 13. Likewise during writing operations current is applied by way of the digit circuits and gate transistors through one or the other of the load transistors 18 or 19 to develop appropriate potential differences at terminals 16 and 17 for forcing the desired stable state upon the flip-flop circuit.

Figure 2:
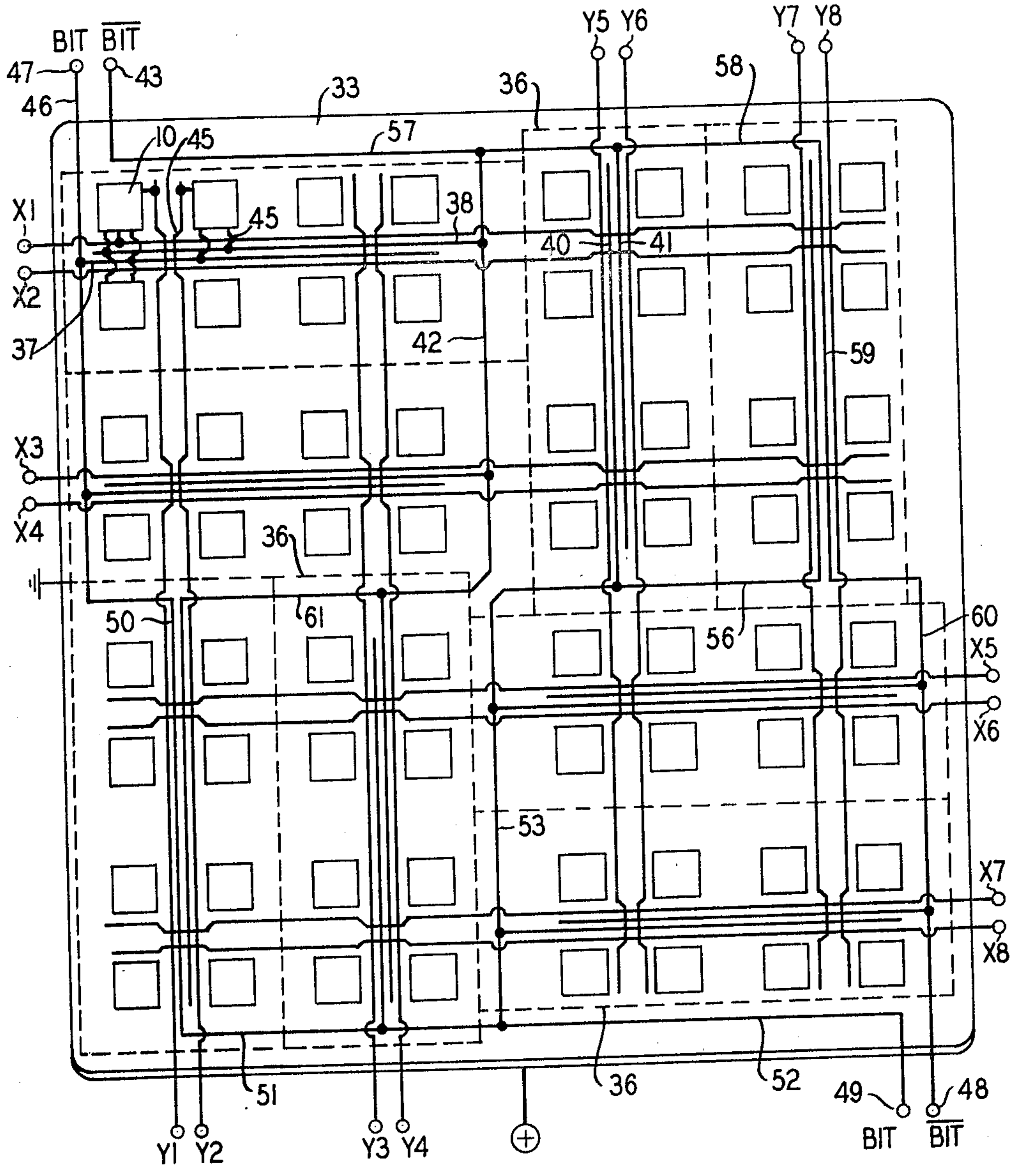
FIG. 2 is a simplified schematic diagram of an arrangement of principal interconnecting circuits for memory cells in a semiconductor chip in accordance with the invention.

In FIG. 2 is shown a simplified schematic diagram for the layout of 64 memory cells of the type shown in FIG. 1 in a common semiconductor substrate 33. Such substrate is one integrated circuit chip that is advantageously interconnected with others, not shown, on a common ceramic substrate, also not shown. Cells are arranged in cell groups having a predetermined ratio of numbers of cells per group and a predetermined group configuration. In a presently preferred embodiment the chip is divided into quadrants, each containing the same number of cells and having the same number of crossunders, of approximately the same impedance each, in control circuits for supplying enabling signals to the cells.

Each cell 10 from FIG. 1 is represented by a different square in FIG. 2. The schematic diagram is shown on the face of the substrate in order to facilitate an understanding of the invention, and one form of actual circuit and device relationships for a cell is shown in, and will be described subsequently in connection with, FIG. 4. Each cell in FIG. 2 is served by power connections, the X- and Y-access circuit connections for enabling cell operation, and a pair of digit circuit connections in the manner indicated in FIG. 1. The X-, Y-, and digit circuit connections are shown for several cells in the upper left-hand corner of substrate 33, and other such connections are omitted to preserve the simplicity of the drawing. Power connections are only partially shown in FIG. 2.

Broken lines, such as the line 36, extending through different parts of the substrate shown in FIG. 2 represent schematically the path followed within a diffusion layer in the chip to provide a ground bus connection for the various cells. This bus does not appear at the surface of the chip since it connects directly within the diffusion layer to the drain electrode diffusion for transistors 18 and 19 of each cell. An external connection for this ground bus to the power supply is shown at the left-hand side of chip 33, but one or more such connections can be provided at any convenient points around the chip. The B+ connection to the chip is shown at the lower edge of chip 33 but it can be made to the substrate 33 at any convenient point along the chip perimeter. Within the chip the source electrode diffusions of each of the transistors 11 and 12 are connected to the substrate at each cell. The B− supply connection for the gate electrodes of transistors 18 and 19 in each cell is accomplished by way of a metallic circuit on the surface of the substrate and generally following over the path of the ground bus diffusion. Such B− circuit is not shown in FIG. 2 since the arrangement thereof on the substrate does not critically affect the invention. The B− circuit simply provides a continuous voltage slightly below ground to the terminals 21 in all of the cells and otherwise carries no significant current. Consequently, the metallic circuit providing this voltage is formed to include crossunders for any intersecting circuits wherever appropriate.

Figure 2A:
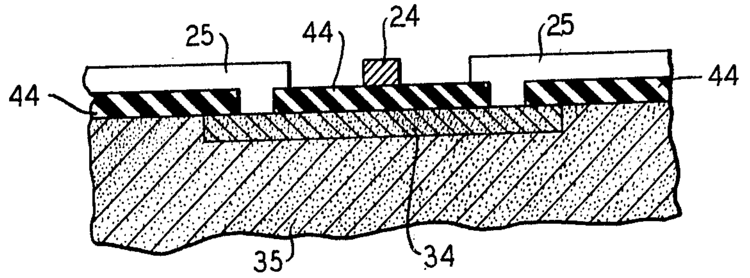
FIG. 2A is a simplified diagram of a circuit crossunder in FIG. 2.

It is known in the art that diffused conduction paths can be formed in a semiconductor chip for various circuit purposes including power buses and circuit crossunder structures. Such paths are doped to display a substantially higher conductivity than does the surrounding semiconductor material. However, such a path has a significantly lower conductivity than a metallic circuit material such as gold or aluminum. Circuit crossunder structures employed in the illustrative embodiment include a diffused conduction path extending under, and insulated from a circuit in an intersecting circuit location. Electrical connection is made at the ends of such diffused conduction paths to the parts of a metallic circuit that are to be included with the crossunder in series in a circuit path. Such a crossunder is shown in simplified form in FIG. 2A where circuits 24 and 25 intersect and the latter includes in series a diffused path 34 extending through semiconductor material 35 and under insulating material 44 and conductor 24. Although insulated circuit crossings are usually schematically indicated by crossed lines, half loops, or jumps, such as the half loop 45 in the upper left portion of FIG. 2, are utilized to indicate most circuit crossunders to make it clear which of two or more intersecting circuits includes the crossunder impedance.

A single basic memory cell configuration is utilized throughout the chip of FIG. 2. It will be seen that adjacent pairs of cells along any row within a chip quadrant are the mirror image of one another, while adjacent pairs of cells along any column within a quadrant are similarly the mirror image of one another. The embodiment of FIG. 2 is conveniently presented in the form of different quadrant portions of the chip; and it will be seen that diagonally opposed quadrants are similarly oriented versions of the same cell arrangement, while the adjacent quadrant portions likewise comprise the same cell quadrant arrangement but rotated 90° in the plane of the drawing. Although the cells are for convenience shown in FIGS. 1 and 2 as being separate from the X-, Y-, and digit circuits, it will be shown in connection with FIG. 4 that segments of the latter circuits are likewise included in the cell arrangement which is rotated in one direction or another to provide the full chip array of cells. This cell uniformity facilitates chip layout under the control of computer-aided design techniques which are now known in the art.

The completed chip array in FIG. 2 includes X-circuits which are metal circuits deposited on the face of the chip and traverse the full two-quadrant width of the chip in pairs of circuits extending between adjacent rows of cells with each circuit of a pair serving a different one of the adjacent rows. Each X-circuit is free of crossunders to accommodate Y-circuits and digit circuits in half of its extent and includes crossunders for those circuits in the other half. The half which is free of such crossunders is all metallic and is found in the chip quadrant adjacent to the driving point for each X-circuit. The portion of the circuit which includes the crossunders is found in chip quadrant which is remote from the driving point for the X-circuit.

Thus, in FIG. 2 the X-circuits X1 and X2 extend across the substrate 33 between the two upper rows of cells and are driven at the left-hand side of the substrate adjacent to the upper left quadrant of the chip. These X-circuits in the latter quadrant include crossunders for only a digit circuit bus at the left-hand side of the quadrant. In the upper right-hand quadrant of the chip the same X-circuits include crossunders for both digit circuits and Y-circuits. Circuits X3 and X4 are similarly arranged to extend through the two upper quadrants of the chip and to be driven from the left-hand side. In a similar fashion X-circuits X5 and X6 extend between the fifth and sixth rows of cells in FIG. 2 and are driven at the right-hand side of the chip adjacent to the lower right quadrant wherein these circuits are essentially free of crossunders. Likewise the X-circuits X7 and X8 extend between the two bottom rows of the chip in a fashion similar to the circuits X5 and X6. Looking at the column circuits for the memory, all are arranged in a fashion similar to that just described for the X-circuits with the Y-circuits Y1 through Y4 being driven at the lower edge of the lower left quadrant of the chip and Y5 through Y8 being driven adjacent to the upper edge of the upper right quadrant.

Digit circuits for the chip of FIG. 2 are conveniently considered in terms of digit lines which serve sets of memory cells, digit buses which interconnect digit lines for respective quadrants of the chip, and digit terminals for making external digit bus connections for the chip. All of the digit circuits are metallic except for short connective diffused portions at each cell as will be noted in connection with FIG. 4. Digit lines such as lines 37 and 38 extend between adjacent rows of cells in chip quadrants adjacent to X-circuit driving points as in the upper left and lower right quadrants in FIG. 2. Digit lines such as lines 40 and 41 extend between adjacent columns of cells in quadrants such as the upper right and lower left quadrants where Y column circuits are driven. These digit circuits are arranged in Bit and $\overline{\text{Bit}}$ pairs which lie between pairs of X- or Y-circuits serving the same memory cells. Each cell is connected to both a Bit line and a $\overline{\text{Bit}}$ line as shown in FIG. 1. Although the latter connections are illustrated in FIG. 2 as crossing different numbers of circuits, the crossunders are in fact approximately the same since in the actual layout the outer, or Y-gate transistors 29 and 30 are advantageously located between the digit lines of a pair at each cell location as will be shown in FIG. 4.

Within any particular quadrant the Bit and $\overline{\text{Bit}}$ digit lines enter the quadrant from opposite sides, respectively, and corresponding lines of the same type within the quadrant are bused together. Thus, in FIG. 2 $\overline{\text{Bit}}$ lines, such as the line 38, enter the upper left quadrant of the chip from the right-hand side and are on that side collected by a bus 42 for connection to a $\overline{\text{Bit}}$ terminal 43. Similarly, Bit lines such as the line 37 in the same quadrant enter from the left-hand side and are collected by a bus 46 for connection to a Bit terminal 47. The buses of the same type are further interconnected so that each cell on the chip has access to the Bit terminals 43 and 47 as well as a corresponding pair of Bit terminals 48 and 49 at the diagonally opposite corner of the chip. This arrangement permits digit circuits for plural chips to be connected in series as is advantageous in certain memory arrangements.

Terminals 47 and 49 are connected together by way of Bit bus 46 in the upper left quadrant, a Bit line 50 and a Bit bus 51 in the lower left quadrant, and a connection 52 in the lower right quadrant. Also arranged as a branch on the same connection between Bit terminals is the series combination of a bit bus 53 serving the lower right quadrant and a Bit bus 56 serving the upper right quadrant. In similar manner $\overline{\text{Bit}}$ terminals 43 and 48 are interconnected by a connection 57, $\overline{\text{Bit}}$ bus 58, $\overline{\text{Bit}}$ line 59, and $\overline{\text{Bit}}$ bus 60, all of which cooperate with a branch connection including the $\overline{\text{Bit}}$ bus 42 serving the upper left quadrant and a $\overline{\text{Bit}}$ bus 61 serving the lower left quadrant.

Figure 3A:
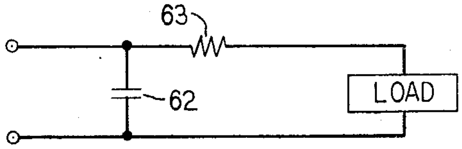
FIGS. 3A, 3B, and 3C are equivalent circuits illustrating one aspect of the invention.

One may expect any chip circuit to have a characteristic impedance including series resistance and shunt-distributed capacitance to the surrounding circuit elements. An ideal equivalent circuit would be as shown in FIG. 3A where a shunt capacitor 62 represents the capacitance lumped near the driving point and a series resistor 63 connected to the load. Upon an application of a voltage at the driving point, the capacitor 62 is rapidly charged through a circuit portion of extremely low time constant to build up an output voltage rapidly for application through resistor 63 to the load. This format of FIG. 3A is not actually attainable in a chip row or column control circuit because of the distributed character of the impedance; but, if it were, it would provide the least signal rise time delay.

Figure 3B:
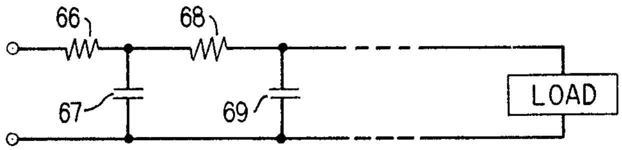

FIG. 3B is the equivalent circuit for the distributed impedance in a chip circuit of a type not otherwise shown in the drawing, where crossunders are included all along the circuit. Each crossunder includes a certain amount of shunt distributed capacitance, which is relatively small, and significant series resistance which is attributable to the fact that the semiconductor material included in the crossunder diffusion has a much higher resistance than does a corresponding length of the metallic portion of the circuit. In FIG. 3B a series resistor 66 and a shunt capacitor 67 represent an initial circuit crossunder to accommodate a digit circuit bus. Those impedances are followed by a plurality of similar sections, each including a resistor 68 and a capacitor 69 representing subsequent crossunders at each intersecting circuit for the situation wherein the circuit under consideration assumes all crossunder functions for circuit intersections. Metallic circuit part distributed capacitance is included in capacitors 67 and 69. It is apparent that a signal applied at the circuit driving point will have an extended rise time because the capacitances of successive sections of the iterative network must be sequentially charged.

Figure 3C:
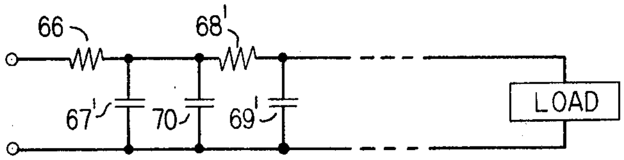

In FIG. 3C is an approximate equivalent circuit of an X- or Y-circuit in FIG. 2. The equivalent circuit includes input resistor 66 and a capacitor 67′ representing the initial crossunder impedance to accommodate a digit circuit bus, as in the case of FIG. 3B. However, this combination is followed by a capacitor 70 which represents the dominant distributed capacitance of the X or Y control circuit quadrant portion which is otherwise free of crossunders. The capacitor 70 is followed by an iterative network including a plurality of resistor-capacitor sections each including a resistor 68′ and a capacitor 69′ wherein each such section represents a crossunder in the portion of the circuit which is required to assume the crossunder function for circuit intersections. However, the total resistive effect is reduced in accordance with the embodiment of FIG. 2 as compared to what it might otherwise be because each crossunder accommodates a plurality of circuits, i.e., a pair of X- or Y-circuits and two digit circuits. Thus, the total length of diffused portions to pass under intersecting circuits is held to a practical minimum.

Accordingly, the individual control circuit arrangement of FIG. 2, as represented by the equivalent circuit of FIG. 3C, provides signal rise time optimization. The dominant portion of the distributed capacitance is that represented by the crossunder-free metallic circuit portion lumped adjacent to the circuit drive point where it can be charged through the smallest possible impedance, i.e., that represented by a single crossunder. Likewise the ladder effect of the part of distributed impedance including the resistances in all the other crossunders is confined to the circuit portion remote from the driving point and is distributed among both X- and Y-circuits so that signal rise time delay for either type of circuit is held down to a minimum.

Figure 4:
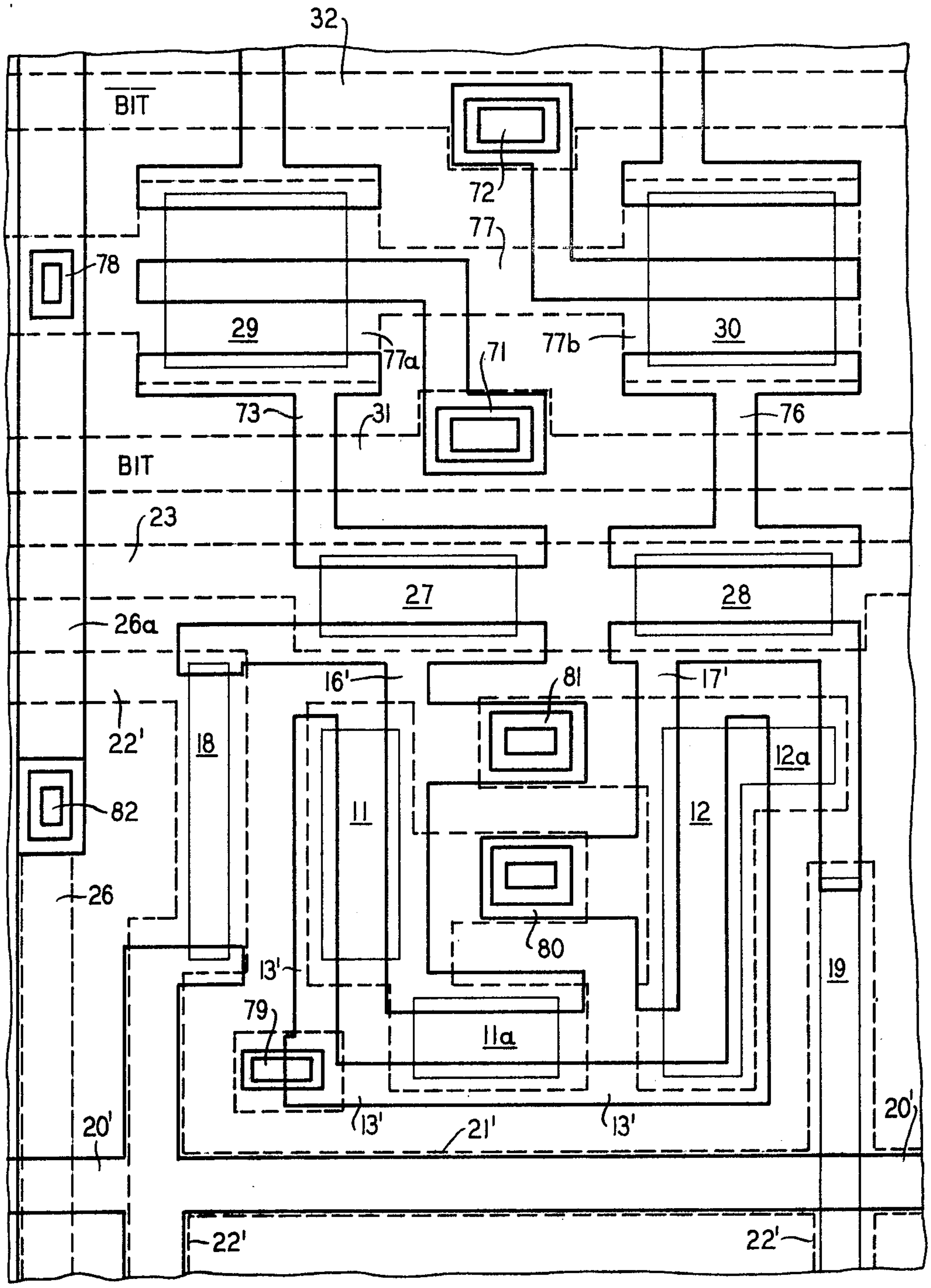
FIG. 4 is a diagram of an actual memory cell layout for the cell of FIG. 1 in the chip arrangement of FIG. 2.

FIG. 4 depicts an actual integrated circuit layout on a semiconductor chip for a memory cell of the type shown in FIG. 1 and illustrating many of the relationships previously discussed for such a cell in regard to FIG. 2. Since an integrated circuit is really a three-dimensional complex of conductors and active devices, FIG. 4 employs a schematic notation that is often utilized in the art to represent in a two-dimensional drawing the three-dimensional features deemed essential to show the features of the present invention. Three levels of interest are shown in FIG. 4. These are a diffusion level wherein the conductive portions are outlined by relatively broad solid lines, a channel level wherein the conductive channels of insulated gate field effect transistors are outlined by relatively narrow solid lines, and surface metallization wherein bands of metallic conductor deposited on the face of the chip are outlined by broken lines. In actual practice many of the broken lines representing the metallized conductors would be directly over lines representing diffused semiconductor regions, and in most cases where this occurs the broken lines have been slightly displaced in order that they may be separately perceived. Connections between the diffusion layer and metallized surface conductors are accomplished in a manner similar to that shown for conductor 25 in FIG. 2A. Thus, holes are etched through an insulating layer which otherwise covers the entire surface of the semiconductor material, including diffused regions. Conductor metal thereafter deposited on the insulating layer extends through the holes to contact semiconductor material at those points. Such contact posts extending through insulation holes are represented by pairs of concentric rectangles. The transistors in FIG. 4 are identified by underlined reference characters which are the same as the reference characters utilized in FIG. 1 and which are located in the channel region for the transistor. Otherwise, reference characters employed in FIG. 4 correspond to those utilized in other figures of the drawing.

$\overline{\text{Bit}}$ circuit 32 and Bit circuit 31 in FIG. 4 are the two metal bands extending transversely across the upper portion of FIG. 2 above and below two dual transistors which include the Y-gate transistors 29 and 30. It was previously noted in connection with FIG. 2 that the Y-gate transistors of the cells were located on the chip between the Bit and $\overline{\text{Bit}}$ lines. Thus, the dual transistors in FIG. 4 each include a different Y-gate transistor for a different memory cell. Two contact posts 71 and 72 connect the Bit and $\overline{\text{Bit}}$ lines 31 and 32 to the diffusion level where diffused conductive paths connect the posts to electrodes of transistors 29 and 30, respectively. Above each of those transistors in the drawing is another transistor which comprises the Y-gate transistor of an additional memory cell above the one shown in the drawing. Thus, for example, the cell shown in FIG. 4 would correspond to the cell in FIG. 2 which is second from the left in the second row of cells from the top of the figure. The conduction paths for transistors 29 and 30 extend through their respective channels to additional diffused conductors 73 and 76 which provide connections to electrodes of the X-gate transistors 27 and 28, respectively.

Overlying the transistors 29 and 30 is a metal conductor 77 with enlarged portions 77*a* and 77*b* that comprise both the gate electrodes and connections thereto for transistors 29 and 30 and which are further connected through a contact post 78 to a Y-conductor crossunder 26*a*. Similar enlarged portions in the X-conductor 23 of FIG. 4 provide gate electrodes and connections thereto for X-gate transistors 27 and 28.

The last-mentioned transistors have diffused electrode portions which are connected through further diffused conductors 16' and 17', corresponding to flip-flop output terminals 16 and 17, to source electrodes of flip-flop load transistors 18 and 19, respectively, and to drain electrodes of the flip-flop transistors 11 and 12, respectively. Metallized band 21' corresponds to terminal 21 in FIG. 1 for interconnected gate electrodes of load transistors 18 and 19 as an extension of the B— bus system for the chip. The latter system includes extensions 22' at the central left-hand portion of FIG. 4 for providing B— voltage to cells to the left of that illustrated in FIG. 4 and a pair of similar downward extensions from the bottom of FIG. 4 to cells below that shown in FIG. 4. Drain electrodes of the load transistors 18 and 19 are connected through diffused conductors to the ground diffusion bus 20' extending across the bottom of FIG. 4.

Flip-flop transistors 11 and 12 in FIG. 4 have their drain electrodes connected into the diffused conductors 16' and 17', respectively. Source electrodes of those transistors are connected through diffused conductors 13' to a post 79 that extends over both the diffused conductor 13' and the common substrate, not shown, where the connection to positive potential source 13 (shown in FIG. 1) is made. A contact post 80 provides the cross coupling connection from the metallized gate electrode of transistor 11 to the diffused drain electrode of transistor 12 included in conductor 17'. Similarly, a contact post 81 provides the cross coupling connection from the drain electrode of transistor 11 to the gate of transistor 12. It will also be seen in FIG. 4 that additional transistors 11*a* and 12*a* are connected in respect to all electrodes in parallel with transistors 11 and 12, respectively. These additional transistors 11*a* and 12*a* may be considered disjoint parts of transistors 11 and 12, respectively, and are consequently not separately shown in FIG. 1. They have been provided in FIG. 4 as separate entities solely for the purpose of utilizing chip space efficiently.

The Y-circuit 26 which serves the cell of FIG. 4 extends up the left side of the FIG. 4. It includes a metal lower portion which is then coupled through a contact post 82 to the diffused conductor portion 26*a* which passes under the aforementioned B— bus 22', the X-conductor 23, Bit line 31, post 78 for connection to conductor 77, and Bit line 32.

If the cell representation of FIG. 4 is rotated 90°in a clockwise direction in the plane of the drawing, it will be seen then to correspond to cells located in the lower left and upper right quadrants of the chip as illustrated in FIG. 2. However, in this new orientation the circuits that were designated Y-circuits must now be designated as X-circuits and vice versa. Such a switch interchanges the X–Y gate functions of the transistor pairs 27, 28 and 29, 30, but the interchange is immaterial since the gate transistors are utilized for a coincidence function and no operative coupling is established unless all four transistors are enabled. Consequently, the rotation causes no change in the black box type operations of the cell.

In summary, then, an integrated circuit chip design has been achieved wherein crossunder loading is distributed among cell-enabling circuits so that signals applied to those circuits are characterized by similar rise and fall times for minimizing signal rise time delays which must be accommodated in overall circuit operation. Furthermore, crossunder loading is advantageously distributed in respective circuits remotely from the circuit-driving point while the bulk of circuit capacitance is located near the driving point for further minimizing signal rise and fall times.

Although the invention has been described in terms of particular embodiments and applications thereof, it is to be understood that additional embodiments, applications, and modifications which will be obvious to those skilled in the art are included within the spirit and scope of the invention.

What is claimed is:

1. In combination,
an integrated circuit chip including multiple cells formed therein and arranged in rows and columns of cells,
a plurality of row circuits and a plurality of column circuits arranged in intersecting array with said row circuits on said chip, said row and column circuits being connected for applying signals to said cells,
each of said row and column circuits including low-impedance conduction means and including higher impedance conduction means for providing electrical crossing means for crossing other circuits at intersections therewith and without electrical connection thereto, and
each of said row and column circuits having a first portion to which a first plurality of said cells are connected and which is free of said crossing means and having a second portion to which a second plurality of said cells are connected and which includes at least one of said crossing means.

2. The combination in accordance with claim 1 in which
the numbers of said crossing means in said second portions of said circuits are substantially the same.

3. The combination in accordance with claim 1 in which
the total impedance of said crossing means in said second portion of one of said circuits is approximately the same as for all other ones of said circuits.

4. The combination in accordance with claim 1 in which
each of said circuits has a driving point for the application of signals to be coupled to cells connected thereto, and
said first portion of each of said circuits is electrically closer to said driving point than is said second portion thereof.

5. The combination in accordance with claim 1 in which
said first portion of each of said circuits has a primarily capacitive distributed impedance, and
said second portion of each of said circuits comprises an iterative network including in each section the series resistance of one of said crossing means and the distributed shunt capacitance of such crossing means.

6. The combination in accordance with claim 1 in which, considering said cells to be grouped in four different quadrants of said chip,
each of said circuits extends through two of said quadrants with its first and second portions serving different ones of such quadrants, respectively, and
each quadrant served by a first portion of a row or column circuit is also served by a second portion of a column or row circuit, respectively.

7. The combination in accordance with claim 1 in which
said chip is a body of semiconductor material,
said row and column circuit low-impedance conduction means are metal conductors deposited on a face of said chip, and
said higher impedance conduction means comprise portions of said semiconductor material doped to have higher conductivity than surrounding portions of such material and extending through said material under at least one intersecting circuit and connected to at least one low-impedance conduction means portion of a circuit.

8. The combination in accordance with claim 1 in which said circuits extend in pairs of circuits of the same row or column set of circuits between pairs of row or column cell groups, respectively, of said cells, and means connect each circuit of a row or column pair of circuits, extending between a row or column, respectively, pair of cell groups, to cells of a different group of such pair of cell groups.

9. The combination in accordance with claim 1 in which a further circuit is provided on said chip and extends to all of said cells, said further circuit including plural circuit lines each extending in physical parallel relation with said first portion of a different one of said row or column circuits, and circuit buses connecting said circuit lines together and to an external connection for said chip.

10. The combination in accordance with claim 9 in which said further circuit is free of said crossing means.

11. The combination in accordance with claim 9 in which each of said circuit lines and circuit buses includes a pair of conductors cooperatively connected for transmission of double-rail logic signals.

12. The combination in accordance with claim 11 in which each of said cells is a flip-flop circuit having a pair of input-output terminals connected to a pair of said conductors for receiving said double-rail logic signals to control the operation state of such cell or for coupling similar signals to said conductors as an indication of the operation state of such cell, a pair of row gate devices and a pair of column gate devices operatively couple said input-output terminals to such conductors in response to a coincidence of signals on a row circuit and a column circuit intersecting at such cell, and one of said pairs of gate devices is formed in said chip between said conductors of said conductor pair.

13. The combination in accordance with claim 11 in which said row circuits extend in pairs between pairs of rows of said cells, each circuit of a pair being connected to a different row of cells, said column circuits extend in pairs between pairs of columns of said cells, each circuit of a pair being connected to a different column of cells, conductors of each of said further circuit lines are arranged between a pair of row or column circuits connected to the same cells as are such conductors, and each row or column circuit second portion intersecting a column or row circuit pair and a further circuit conductor pair connected to the same cells includes a single one of said crossing means to cross both such pairs of circuits.

* * * * *